United States Patent
Drogi et al.

(10) Patent No.: US 8,400,217 B2
(45) Date of Patent: Mar. 19, 2013

(54) RF POWER AMPLIFIER CIRCUIT WITH MISMATCH TOLERANCE

(75) Inventors: Serge Francois Drogi, Flagstaff, AZ (US); Martin A. Tomasz, San Francisco, CA (US)

(73) Assignee: Quantance, Inc., San Mateo, CA (US)

( * ) Notice: Subject to any disclaimer, the term of this patent is extended or adjusted under 35 U.S.C. 154(b) by 0 days.

(21) Appl. No.: 13/461,697

(22) Filed: May 1, 2012

(65) Prior Publication Data
US 2012/0223777 A1  Sep. 6, 2012

Related U.S. Application Data

(63) Continuation of application No. 12/794,670, filed on Jun. 4, 2010, now Pat. No. 8,183,917.

(51) Int. Cl.
*H03G 3/20* (2006.01)
*H03F 3/04* (2006.01)

(52) U.S. Cl. .................................. 330/129; 330/297
(58) Field of Classification Search .................. 330/136, 330/129, 297
See application file for complete search history.

(56) References Cited

U.S. PATENT DOCUMENTS

| | | | |
|---|---|---|---|
| 5,142,240 A | 8/1992 | Isota et al. | |
| 6,449,465 B1 * | 9/2002 | Gailus et al. | 455/126 |
| 6,646,501 B1 | 11/2003 | Wessel | |
| 6,703,897 B2 * | 3/2004 | O'Flaherty et al. | 330/149 |
| 6,741,127 B2 | 5/2004 | Sasho et al. | |
| 7,109,791 B1 | 9/2006 | Epperson et al. | |
| 7,190,221 B2 | 3/2007 | Henze | |
| 7,279,979 B2 | 10/2007 | Autti | |
| 7,440,731 B2 | 10/2008 | Staudinger et al. | |
| 8,183,917 B2 | 5/2012 | Drogi et al. | |
| 2002/0053897 A1 | 5/2002 | Kajiwara et al. | |
| 2002/0168949 A1 | 11/2002 | Johannisson et al. | |
| 2003/0017840 A1 | 1/2003 | Katagishi et al. | |
| 2004/0075504 A1 | 4/2004 | Vintola | |
| 2005/0208907 A1 | 9/2005 | Yamazaki et al. | |
| 2005/0227646 A1 | 10/2005 | Yamazaki et al. | |
| 2007/0184793 A1 | 8/2007 | Drogi et al. | |
| 2009/0096533 A1 | 4/2009 | Paul et al. | |

FOREIGN PATENT DOCUMENTS

JP 62-274906 11/1987

OTHER PUBLICATIONS

PCT International Search Report and Written Opinion, PCT Application No. PCT/US11/36323, Aug. 19, 2011, 12 pages.
Qiao, D. et al., "Antenna Impedance Mismatch Measurement and Correction for Adaptive CDMA Transceivers," Microwave Symposium Digest, 2005 IEEE MTT-S International, Jun. 12-17, 2005, pp. 783-786 [Online] [Retrieved on Aug. 13, 2011].

* cited by examiner

*Primary Examiner* — Robert Pascal
*Assistant Examiner* — Khiem Nguyen
(74) *Attorney, Agent, or Firm* — Fenwick & West LLP

(57) ABSTRACT

A radio frequency (RF) power amplifier system adjusts the supply voltage provided to a power amplifier (PA) adaptively, responsive to the measured or estimated power of the RF output signal of the PA. The RF PA system includes a power amplifier (PA) which receives and amplifies an RF input signal to generate an RF output signal at a level suitable for transmission to an antenna. A PA supply voltage controller generates a supply voltage control signal, which is used to control the supply voltage to the final stage of the PA. The supply voltage control signal is generated responsive to the measured or estimated power of the PA RF output signal, and also may be responsive to a parameter indicative of impedance mismatch experienced at the PA output. By controlling this supply voltage to the RF PA, the efficiency of the PA is improved.

30 Claims, 11 Drawing Sheets

RF POWER AMPLIFIER CIRCUIT WITH MISMATCH TOLERANCE

CROSS REFERENCE TO RELATED APPLICATIONS

This application is a continuation application of, and claims priority under 35 U.S.C. §120 from co-pending U.S. patent application Ser. No. 12/794,670, entitled "RF Power Amplifier Circuit With Mismatch Tolerance," filed on Jun. 4, 2010, the subject of which is incorporated by reference herein in its entirety.

BACKGROUND

1. Field of the Invention

The present invention relates to a circuit for controlling RF PAs (Radio Frequency Power Amplifiers), and more specifically, to an RF PA controller circuit that adjusts the supply voltage of RF PAs.

2. Description of the Related Art

RF (Radio Frequency) transmitters and RF power amplifiers are widely used in portable electronic devices such as cellular phones, laptop computers, and other electronic devices. RF transmitters and RF power amplifiers are used in these devices to amplify and transmit the RF signals remotely. RF PAs are one of the most significant sources of power consumption in these electronic devices, and their efficiency has a significant impact on the battery life of these portable electronic devices. For example, cellular telephone makers make great efforts to increase the efficiency of the RF PA systems, because the efficiency of the RF PAs is one of the most critical factors determining the battery life of the cellular telephone and its talk time.

FIG. 1 illustrates a conventional RF transmitter circuit, including a transmitter integrated circuit (TXIC) 102 and an external power amplifier (PA) 104. In some cases, there may be a filter between the TXIC 102 and the PA 104. For example, the RF transmitter circuit may be included in a cellular telephone device using one or more cellular telephone standards (modulation techniques) such as UMTS (Universal Mobile Telephony System) or CDMA (Code Division Multiple Access), although the RF transmitter circuit may be included in any other type of RF electronic devices. For purposes of illustration only, the RF transmitter circuit will be described herein as a part of a cellular telephone device. The TXIC 102 generates the RF signal 106 to be amplified by the PA 104 and transmitted 110 remotely by an antenna (not shown). For example, the RF signal 106 may be an RF signal modulated by the TXIC 102 according to the UMTS or CDMA standard.

The RF power amplifier 104 in general includes an output transistor (not shown) as its last amplification stage. When an RF modulated signal 106 is amplified by the PA 104, the output transistor tends to distort the RF modulated signal 106, resulting in a wider spectral occupancy at the output signal 110 than at the input signal 106. Since the RF spectrum is shared amongst users of the cellular telephone, a wide spectral occupancy is undesirable. Therefore, cellular telephone standards typically regulate the amount of acceptable distortion, thereby requiring that the output transistor fulfill high linearity requirements. In this regard, when the RF input signal 106 is amplitude-modulated, the output transistor of the PA 104 needs to be biased in such a way that it remains linear at the peak power transmitted. This typically results in power being wasted during the off-peak of the amplitude of the RF input signal 106, as the biasing remains fixed for the acceptable distortion at the peak power level.

Certain RF modulation techniques have evolved to require even more spectral efficiency, and thereby forcing the PA 104 to sacrifice more power efficiency. For instance, while the efficiency at peak power of an output transistor of the PA 104 can be above 60%, when a modulation format such as WCDMA is used, with certain types of coding, the efficiency of the PA 104 falls to below 30%. This change in performance is due to the fact that the RF transistor(s) in the PA 104 is maintained at an almost fixed bias during the off-peak of the amplitude of the RF input signal 106.

Certain conventional techniques exist to provide efficiency gains in the PA 104. One conventional technique improves the efficiency in the PA 104 by lowering the supply voltage 108 to the PA 104 provided by a power supply such as the switched mode power supply (SMPS) 112. By using a lower supply voltage 108, the PA 104 operates with increased power efficiency because it operates closer to the saturation point. However, the supply voltage 108 cannot be reduced too low, because this would cause the PA 104 to operate with insufficient voltage headroom, resulting in unacceptable distortion. As described previously, the distortion may cause energy from the transmitted signal to spill over to adjacent channels, increasing spectral occupancy and causing interference to radios operating in those neighboring channels. Thus, an optimal supply voltage should be chosen for the PA which balances acceptable distortion with good efficiency.

One conventional method uses a fixed output voltage step-down regulator such as switched mode power supply (SMPS) 112 to lower the supply voltage 108 to the PA 104. However, choosing a fixed power supply voltage is not sufficient in many applications. For example, in most cellular systems, the PA output power changes frequently because the base station commands the cellular handset to adjust its transmitted power to improve network performance, or because the handset changes its transmitted information rate. When the PA output power changes, the optimum supply voltage for the PA (as described above) changes.

Therefore, in some systems, the expected power of the RF output signal 110 is first determined, and then the power supply voltage 108 is adjusted in accordance with the expected power. By adaptively adjusting the supply voltage 108, the efficiency of the PA 104 is increased across various PA output power levels. Conventional methods estimate the expected power of the RF output signal 110 in an "open loop" manner, in which the power of the RF output signal 110 is estimated from the power of the delivered RF input signal 106. However, an estimate of the power of the RF output signal 110 may still not be sufficient for properly adjusting the supply voltage 108. For example, the peak-to-average ratio (PAR) needs to be known in order to estimate the optimum supply voltage for the PA. The PAR refers to the difference of the mean amplitude and the peak amplitude in the modulated RF output signal 110. With a higher PAR, a higher supply voltage is needed to accommodate the peak voltage swings of the RF output signal 110. Many modern cellular systems change the PAR of the modulation in real time, requiring the supply voltage to be adjusted accordingly. Therefore, the conventional method of adjusting the supply voltage 108 of PA 104 based on an estimate of the PA output power is unsuitable in these cellular systems.

Further, the load presented to the PA 104 poses another significant problem. The PA 104 normally drives circuitry usually consisting of a filter and an antenna. Such circuitry typically has nominal impedance around the range of 50 ohms. However, the impedance of the circuitry can sometimes change radically from the nominal. For example, if the antenna is touched or the cellular device is laid down on a metal surface, the impedance of the antenna changes, reflecting impedance changes back to the PA 104. The changes in the impedance of the circuitry coupled to the PA 104 may require changes in the supply voltage to the PA 104 to prevent distortion of the RF output signal 110 fed to this circuitry. The conventional methods described above, however, do not adjust the supply voltage in response to changes in the impedance of the circuitry.

Although the problems of impedance changes at the output of PA 104 can be avoided by constantly providing a higher than optimum supply voltage to the PA 104, the higher supply voltage leads to a less efficient PA 104. In other words, conventional PA controllers are not able to adjust the power supply for the PA responsive to conditions of output impedance of the PA to maximize the PA efficiency while keeping distortion of the amplified RF signal to an acceptable level.

SUMMARY

Embodiments of the present invention include a radio frequency (RF) power amplifier system that adjusts the supply voltage provided to the PA adaptively, responsive to the measured or estimated power of the RF output signal of the PA. The RF PA system includes a power amplifier (PA) which receives and amplifies an RF input signal to generate an RF output signal at a level suitable for transmission to an antenna. A PA VCC (supply voltage) controller generates a supply voltage control signal, which is used to control the supply voltage to the final stage of the PA. The supply voltage control signal is generated responsive to the measured or estimated power of the PA RF output signal, and also may be responsive to a measured parameter indicative of impedance mismatch experienced at the PA output. By controlling this supply voltage to the RF PA, the efficiency of the PA is improved.

In one embodiment, the supply voltage control signal is generated responsive to the average power of the RF output signal of the PA, and also responsive to the peak-to-average ratio of the RF output signal of the PA. In another embodiment, the supply voltage control signal is generated responsive to the instantaneous power envelope of the RF output signal of the PA.

In another embodiment, a phase correction loop is added to the RF PA system, the phase correction loop generating a phase error signal indicative of a phase difference between phases of the RF input signal and the RF output signal and adjusting the phase of the RF input signal to the PA based upon the phase error signal to reduce phase distortion generated by the power amplifier that may occur when the PA supply voltage is adjusted.

In another embodiment, the PA VCC controller is replaced with a PA impedance adjustment controller, and an impedance adjustment circuit at the output of the PA is adjusted, rather than the supply voltage to the PA. The impedance adjustment controller provides an impedance control signal, which is used to control an impedance transformer at the RF output of the PA. The impedance control signal is responsive to a measured parameter indicative of impedance mismatch experienced at the PA output. By controlling this impedance transformer, an impedance close to the nominal value of the impedance of the antenna is presented at the output of the PA, and thus the efficiency of the PA is improved.

The features and advantages described in the specification are not all inclusive and, in particular, many additional features and advantages will be apparent to one of ordinary skill in the art in view of the drawings, specification, and claims.

Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the present invention can be readily understood by considering the following detailed description in conjunction with the accompanying drawings.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made to several embodiments of the present invention(s), examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

In general, a radio frequency (RF) power amplifier system is configured to adjust the supply voltage provided to the PA adaptively, responsive to the measured or estimated power of the RF output signal of the PA. The supply voltage to the PA may also be adjusted responsive to a measured parameter indicative of impedance mismatch experienced at the PA output. By controlling the supply voltage to the RF PA, the efficiency of the PA is improved. Alternatively, the RF PA system may be configured to control the impedance seen at the output of the PA, responsive to a measured parameter indicative of impedance mismatch experienced at the PA output. By controlling the impedance, an impedance close to the nominal value of the impedance of the antenna is presented at the output of the PA, and thus the efficiency of the PA is improved.

Figure 1:
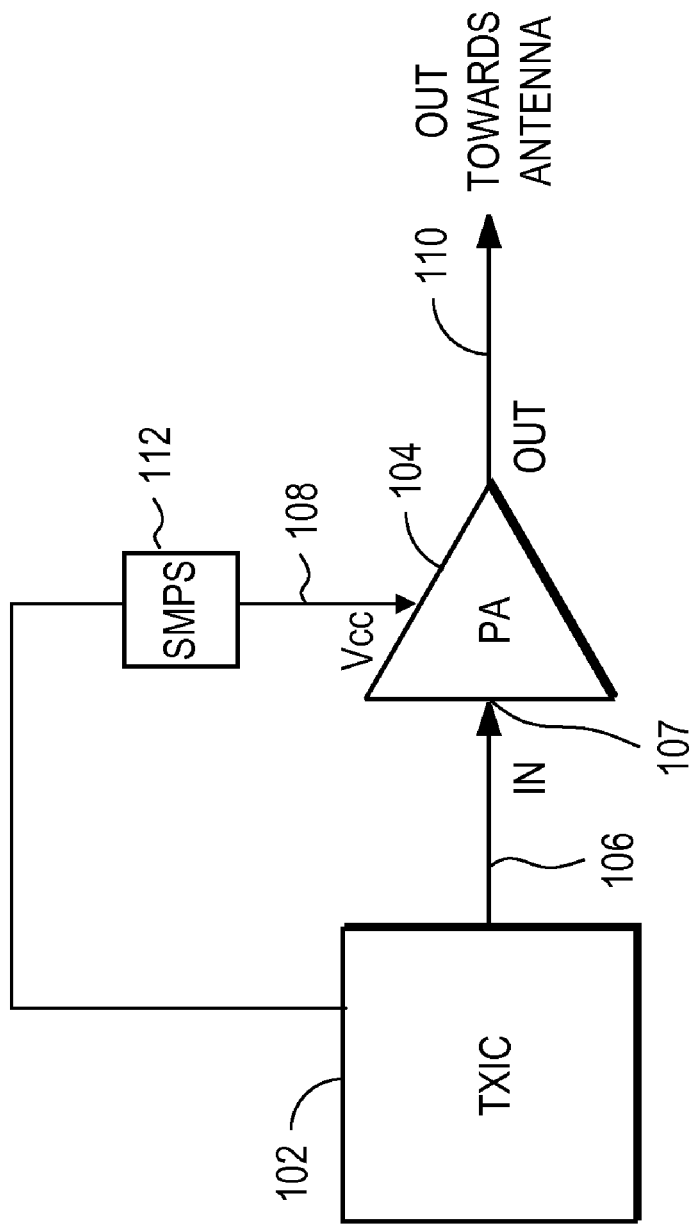
FIG. 1 illustrates a conventional RF transmitter system.
Figure 2A:
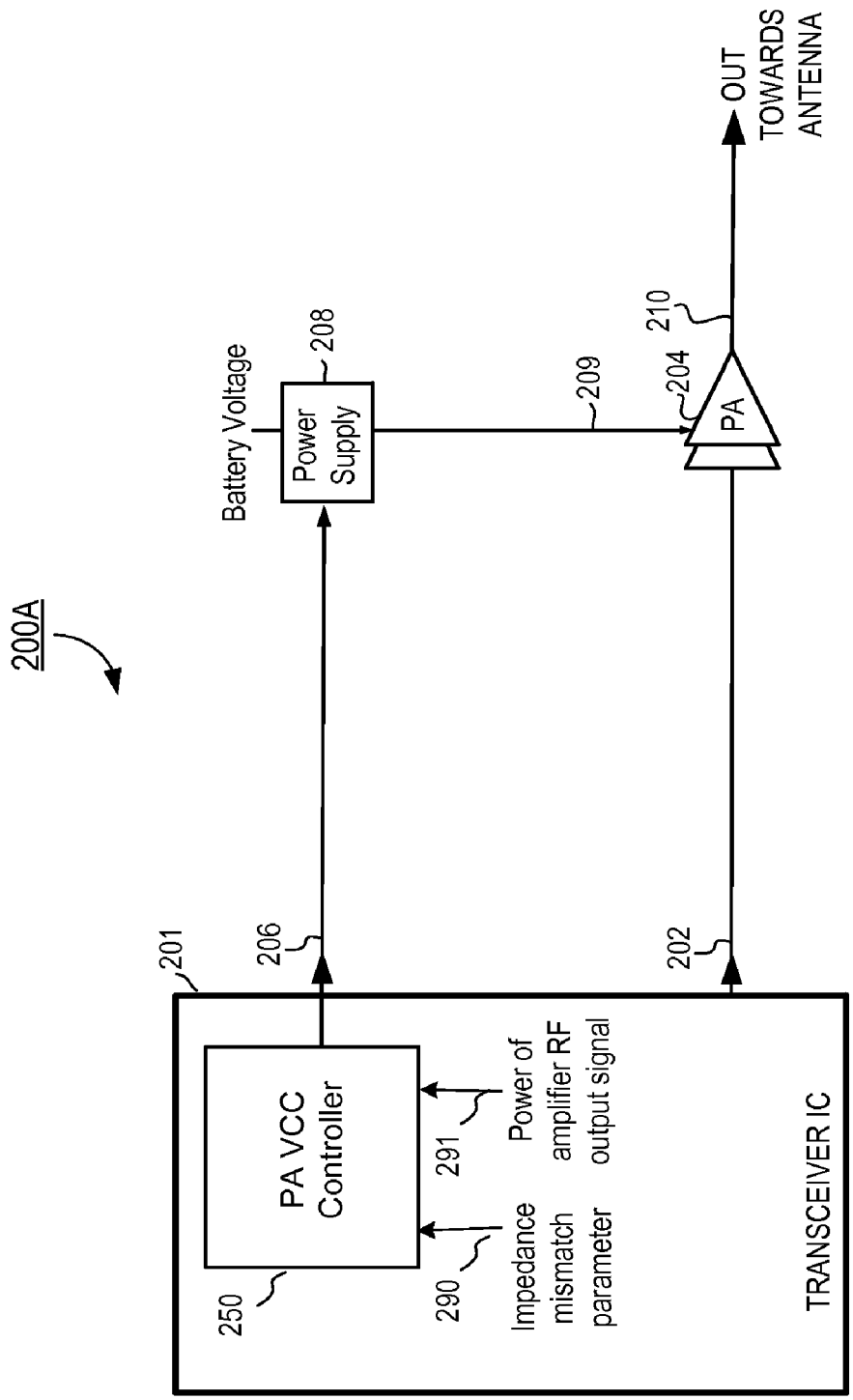
FIG. 2A illustrates an RF PA system that includes a PA VCC controller according to one embodiment of the present invention.

Turning to the figures, FIG. 2A illustrates an RF power amplifier (PA) system 200A, describing the elements of the invention. Transceiver IC 201 provides RF input signal 202 to PA 204, and PA 204 amplifies this signal to output 210, to a level suitable to be passed ultimately to an antenna (not shown). Supply voltage 209 to PA 204 is provided by adjustable power supply 208. The output voltage of power supply 208 is controlled 206 by PA VCC (supply voltage) controller 250. PA VCC controller 250 adjusts the output voltage 209 of power supply 208 responsive to the power 291 of the RF output signal of the power amplifier and a parameter 290 indicative of impedance mismatch at an output of the power amplifier.

Figure 2B:
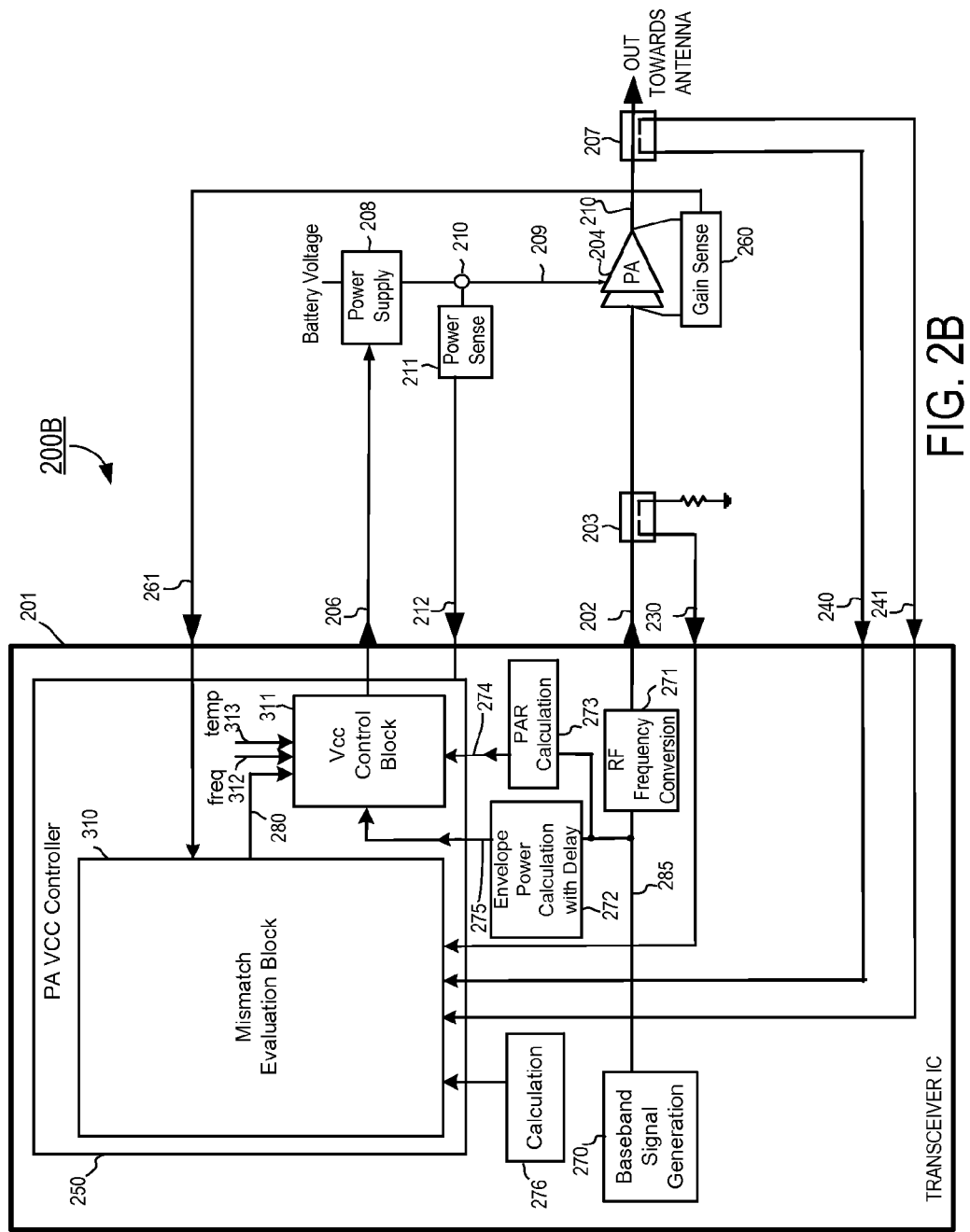
FIG. 2B illustrates an RF PA system that includes a PA VCC controller according to one embodiment of the present invention with additional details.

FIG. 2B illustrates an RF power amplifier (PA) system 200B with more detail, that includes a PA VCC controller 250 for generating a VCC control signal 206, which in turn controls the output voltage 209 from power supply 208 which feeds PA 204. VCC controller 250 generates the VCC control signal 206 in response to a number of inputs in accordance with one embodiment of the present invention. In this illustration, PA VCC controller 250 is contained within transceiver IC 201. Transceiver IC 201 may be a mixed signal IC which further includes baseband signal generation block 270, RF frequency conversion block 271, and various calculation blocks 272, 273, and 276, which will be described later.

The main transmit signal path originates at baseband signal generation block 270, where the baseband-modulated signal intended for transmission is digitally generated. RF frequency conversion block 271 upconverts the signal 285 to a desired RF carrier frequency, generating RF signal 202. Additional amplification and filtering circuitry (not shown) may be included within conversion block 271. Signal 202 passes through directional coupler 203, and enters PA 204. PA 204 may be a 2 or 3 stage RF power amplifier, and provides an RF output signal 210 to drive a number of passive components such as directional coupler 207 and other components (not shown), and ultimately drives an antenna for transmission. Power sense block 211 and gain sense block 260 are described later.

PA VCC controller 250 includes VCC control block 311 and mismatch evaluation block 310. VCC control block 311 generates VCC supply control signal 206 based on a plurality of input signals. The primary input signal is envelope power signal 275, which represents the envelope power at the output of PA 204. Fundamentally, VCC supply control signal 206 is adjusted to ensure that PA VCC voltage 209 tracks this envelope power at the output 210 of the PA 204—for higher envelope power at the output 210 of the PA 201, VCC control block 311 adjusts the level of VCC control signal 206 in order to increase PA VCC voltage 209, and vice versa. Envelope power calculation block 272 estimates the envelope power present at the output 210 of PA 204 by determining the envelope power in the signal 285 generated by baseband signal generation block 270, and scales this power by a gain factor accounting for the difference in power between the output 210 of PA 204 and the output 285 of baseband signal generation block 270. If the baseband signal generation block 270 provides a baseband signal represented by I (inphase) and Q (quadrature) channels, envelope power calculation block 272 would determine the envelope power to be sqrt($I^2+Q^2$), scaled by this gain factor.

PA VCC control block 311 may generate VCC control signal 206 to cause the output 209 of power supply 208 to track either the instantaneous or averaged envelope power of the RF output signal 210 of PA 204. In the case that instantaneous power is tracked, power supply 208 is controlled at a speed equal to the amplitude modulation rate of the signal 285 generated by baseband signal generation block 270. In this case, envelope power calculation block 272 may in some cases include a time delay to account for the fact that the envelope power of the output 210 is estimated based on signal 285, so that the PA VCC voltage 209 will properly track the envelope power of the output 210 of PA 204 in time.

If average power is tracked, a low pass filter (not shown) may be included in envelope power calculation block 272 to determine this average power. Also in this case, the PAR indicator signal 274 is additionally input to VCC control block 311, since the instantaneous peaks of the modulation of signal 285 are averaged and this information is no longer present in envelope power signal 275. PAR refers to the peak-to-average ratio of the signal 285 generated by baseband signal generation block 270. VCC control block 311 adjusts VCC control signal 206 based on PAR indicator signal 274 in order to increase PA VCC voltage 209 if a higher PAR level is indicated, and to lower PA VCC voltage 209 if a lower PAR level is indicated, in addition to being adjusted based on the envelope power signal 275. PAR calculation block 273 may determine PAR indicator signal 274 with predetermined information stored therein regarding the particular modulation generated by baseband signal generation block 270.

Another input to VCC control block 311 is mismatch indicator signal 280. Mismatch indicator signal 280 is generated by mismatch evaluation block 310, and indicates the degree and type of impedance mismatch present at the output 210 of PA 204. VCC control block 311 adjusts VCC control signal 206 based on mismatch indicator signal 280 in order to increase or decrease PA VCC voltage 209, depending on the indication of the mismatch indicator signal 280. The generation of mismatch indicator signal 280 is described in detail in later sections.

VCC control block 311 may also include frequency (freq) 312 and temperature (temp) 313 inputs, which provide information regarding the carrier frequency of the RF signal 202 and the ambient temperature, respectively. VCC control block 311 may adjust VCC control signal 206 based on freq 312 and temp 313 inputs in order to increase or decrease PA VCC voltage 209, depending on the expected changes in gain factor representing the difference in power between the output 210 of PA 204 and the output of baseband signal generation block 270 due to changes in carrier frequency and temperature, respectively. Thus freq 312 signal and temp 313 signals may be generated by lookup tables which reference changes in gain factor (from nominal) to the currently operating carrier frequency and ambient temperature, respectively. For example, internally PA 204 may include frequency-selective matching networks which provide the highest gain at the center of the operating frequency band, and lowest gain at the edges of the operating frequency band. Thus, utilizing said lookup tables, PA VCC 209 may be set to increase and decrease from the nominal corresponding to whether the operating carrier frequency is at the center or at the edges of the operating frequency band, respectively. Also, PA 204 as well as RF frequency conversion block 271 may exhibit an increase in gain at lower temperatures. Thus utilizing said lookup tables, PA VCC 209 may be set to increase or decrease from the nominal corresponding to whether the ambient temperature is lower or higher, respectively. Note that in an alternative configuration, envelope power calculation block 272 may include the factors of frequency and temperature in the calculation of envelope power, and thus obviate the need for freq 312 and temp 313 signals to the Vcc control block 311.

Figure 3A:
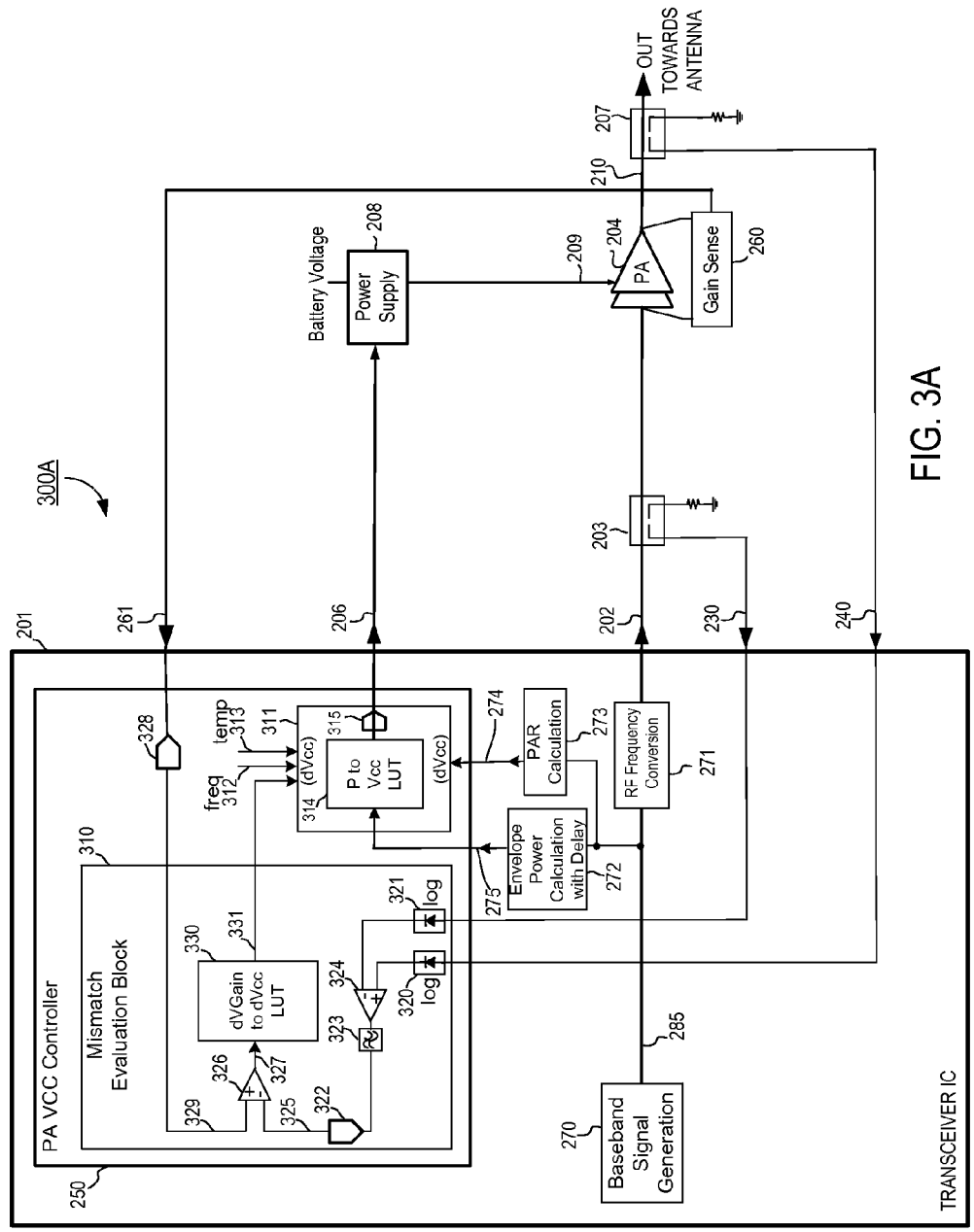
FIG. 3A illustrates an RF PA system that includes the details of the PA VCC controller according to a first embodiment of the present invention.

FIG. 3A illustrates an RF PA system 300A that includes the details of the PA VCC controller according to a first embodiment of the present invention. Specifically, FIG. 3A illustrates the operation of mismatch evaluation block 310, the generation of mismatch indicator signal 331, and the Vcc control block 311 in more detail. "Mismatch" in this context refers to the impedance mismatch seen at the output 210 of PA204. The antenna circuitry following PA 204 typically has nominal impedance around the range of 50 ohms. However, the impedance of the antenna circuitry can sometimes change radically from the nominal impedance. For example, if the antenna is touched or the cellular device is laid down on a metal surface, the impedance of the antenna changes, reflecting impedance changes back to the output 210 of PA 204. The changes in the impedance of the antenna circuitry coupled to the output 210 of the PA 204 may necessitate changes in the VCC supply voltage 209 to the PA 204 to prevent distortion of the RF output signal 210 fed to the antenna circuitry. Thus, the mismatch evaluation block 310 further optimizes the power amplifier system 300 by influencing PA VCC controller 250 to adjust power supply 208 which feeds PA 204 to account for such impedance mismatch.

In this embodiment, mismatch evaluation block 310 evaluates the degree of impedance mismatch as seen at the output 210 of PA 204 by calculating the difference or ratio between the voltage gain and the forward power gain of PA 204, and generates mismatch indicator signal 331 to indicate whether PA VCC voltage 209 should be increased or decreased due to such impedance mismatch. Mismatch indicator signal 331 is then input to VCC control block 311, influencing PA VCC controller 250 for generating VCC control signal 206, which in turn controls the output voltage 209 from power supply 208 that feeds PA 204. In some cases, the offset voltage of PA VCC voltage 209 may also be adjusted.

Specifically, the forward power gain of PA 204 is measured using directional coupler 207 (at the output) and directional coupler 203 (at the input), log detectors 320 and 321, and difference amplifier 324. Directional couplers 207, 203 may be surface mounted types with 20 dB coupling factor, and the log detectors 320, 321 may be diode-type detectors configured with circuitry to provide a log response. Forward power at the input and output of PA 204 is represented by signals 230 and 240, respectively. Log detectors 321 and 320 derive the envelope power from these signals 230, 240, respectively, and their difference is determined with difference amplifier 324, filtered with low pass filter 323, and converted to a digital gain signal 325 using analog-to-digital converter (ADC) 322. Thus, digital power gain signal 325 represents the forward power gain of PA 204.

The voltage gain of PA 204 is measured using gain sense block 260 (details described later) to generate voltage gain signal 261. Voltage gain signal 261 is digitized by ADC 328, providing digital voltage gain signal 329. The difference between digital voltage gain signal 329 and digital power gain signal 325 is determined using digital subtractor 326, which difference signal 327 is input to referencing a LUT (look-up table) 330. LUT 330 is a table that maps dVGain to dVcc, referencing changes in PA VCC (dVcc) required for various values of difference 327 (dVGain) between the voltage gain and the power gain of PA 204. Typically, when the voltage gain 329 of PA 204 is greater than the power gain 325 of PA 204, PA VCC voltage 209 should be increased to account for a higher drive point impedance reflected to the final stage transistor in PA 204, while a voltage gain 329 less than the power gain 325 of PA 204 indicates that PA VCC voltage 209 should be decreased to account for a lower drive point impedance. The output (reference) 331 of LUT 330 indicates the amount of change in the PA supply voltage Vcc necessitated by such impedance mismatch as indicated by the difference between the voltage gain and the forward power gain of PA 204, and is input to VCC control block 311 for use in generating the Vcc control signal 206.

FIG. 3A also shows VCC control block 311 in greater detail. In this example, VCC control block 311 include LUT 314, referencing values (Vcc) of VCC control signal referenced by the envelope power signal 275, outputting them to digital-to-analog converter (DAC) 315 and thus providing an analog version of VCC control signal 206. As described earlier, VCC control signal 206 controls the output 209 of power supply 208 to closely track envelope power signal 275. The values in LUT 314 may be placed to optimize the envelope power signal (P) to PA VCC voltage transfer function. In addition, the LUT 314 may be further optimized to take into consideration the values of the mismatch indicator signal 331, the carrier frequency 312, and the ambient temperature 313. Additionally, LUT 314 may contain a limited range of values, in order to control power supply 208 to limit the voltage excursion of PA VCC voltage 209. For example, it may be desirable to limit the voltage excursion to 2V minimum, to reduce the burden of fast slew rates on power supply 208 in the case that instantaneous power envelope is tracked.

Figure 3B:
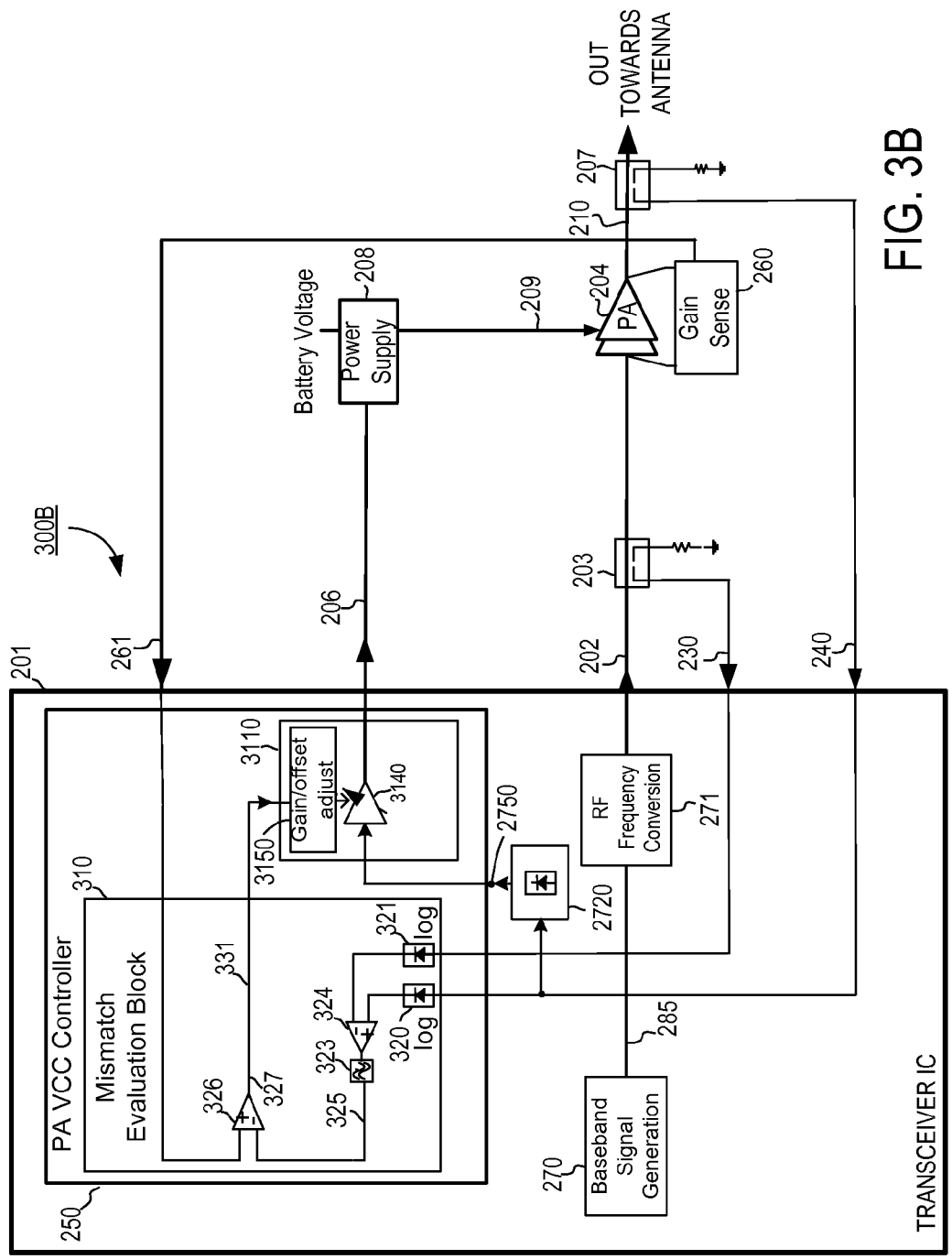
FIG. 3B illustrates an RF PA system that includes the details of the PA VCC controller according to a second embodiment of the present invention.

FIG. 3B illustrates an RF PA system that includes the details of the PA VCC controller according to a second embodiment of the present invention. The RF PA system 300B of FIG. 3B is a variation to the RF PA System 300A shown in FIG. 3A. In this case, VCC control block 310 is configured to respond directly to the measured power envelope of the output signal 210 of PA 204 through forward sampled power signal 240 from directional coupler 207, as indicated by envelope detector 2720, rather than responding to an estimate of the power envelope of output signal 210 utilizing the calculations made with envelope power calculation block 272, as described earlier with reference to FIG. 3A. In this example, envelope detector 2720 tracks the instantaneous power envelope of the RF output signal 210 of PA 204. Thus, the VCC control block 3110 is comprised of predominantly analog components, in order to speed the response of PA VCC voltage 209, since the power envelope of the output signal 210 must track with the PA VCC voltage 209. Envelope power calculation block 272 is replaced with envelope detector block 2720, and envelope detector block 2720 is fed with forward sampled power signal 240, derived from the forward power port of directional coupler 207 at the output of PA 204.

VCC control block 3110 includes variable gain amplifier (VGA) 3140 which feeds the measured envelope power signal 2750 from envelope detector block 2720 through to control power supply 208 in concert with envelope power signal 2750. Mismatch evaluation block 310 provides mismatch indicator signal 331 to gain/offset adjust block 3150 to adjust the gain and offset of VGA 3140 in a manner similar to adjusting LUT 314 previously described with reference to FIG. 3A.

Otherwise, the RF PA system 300B is substantially similar to the RF PA system 300A of FIG. 3A. While FIG. 3B depicts a variation to RF PA system 300A depicted in FIG. 3A, it should be noted that the same variation may be applied to any of the subsequent embodiments shown in FIGS. 3C, 3D, 3E, and 3F.

Figure 3C:
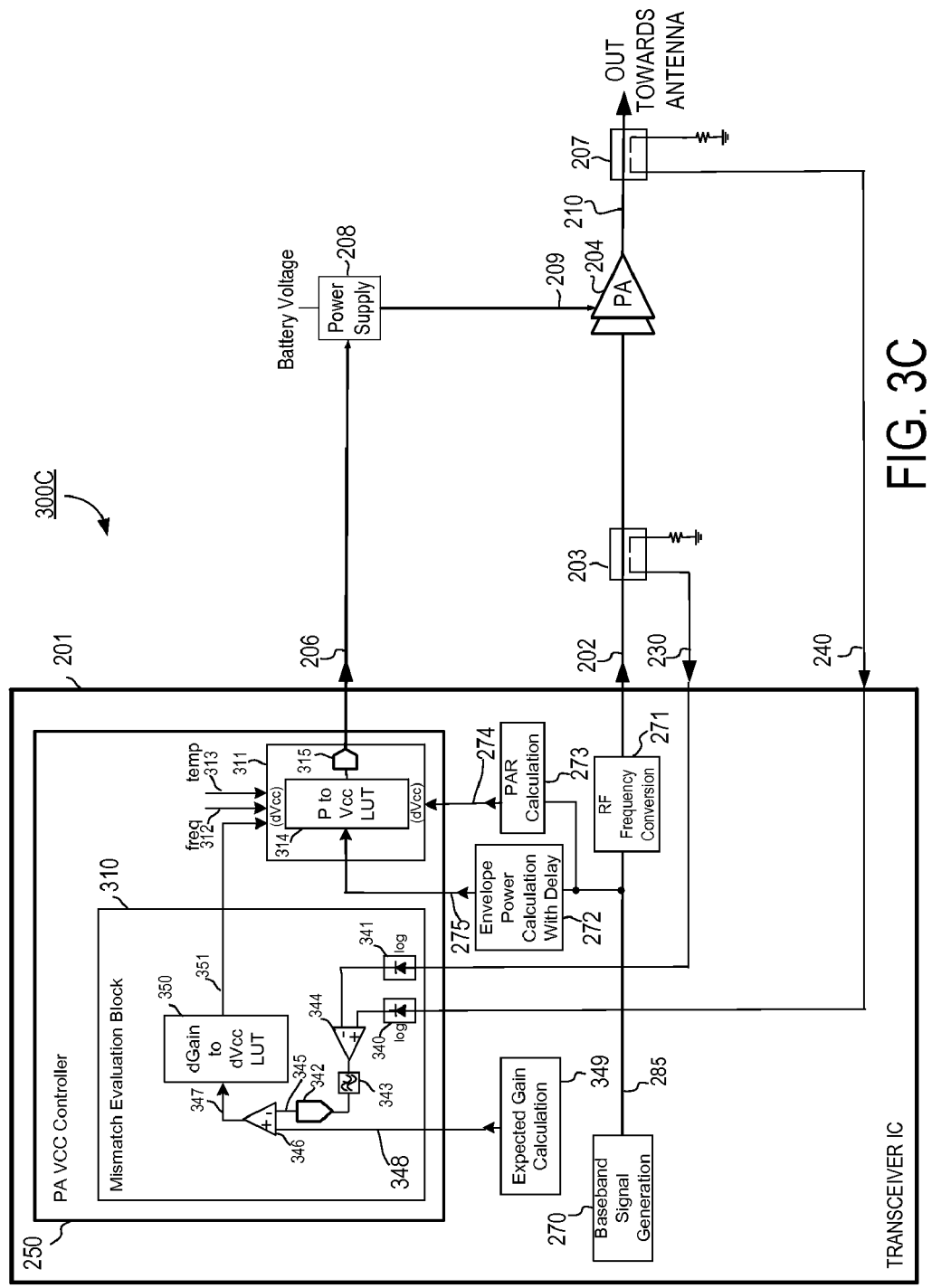
FIG. 3C illustrates an RF PA system that includes the details of the PA VCC controller according to a third embodiment of the present invention.

FIG. 3C illustrates an RF PA system that includes the details of the PA VCC controller according to a third embodiment of the present invention. The RF PA system 300C of FIG. 3C is also a variation of the RF PA system 300A of FIG. 3A. In the RF PA system 300C of FIG. 3C, mismatch evaluation block 310 evaluates the degree of impedance mismatch as seen at the output 210 of PA 204 by calculating the difference or ratio between the nominal power gain of PA 204—as expected with PA 204 driving nominal impedance at its output 210 with no mismatch—and the actual measured gain of PA 204, and generates mismatch indicator signal 351 to indicate whether PA VCC voltage 209 should be increased or decreased due to this impedance mismatch at the output 210 of PA 204. Mismatch indicator signal 351 is then input to VCC control block 311, influencing PA VCC controller 250 for generating a VCC control signal 206, which in turn controls the output voltage 209 from power supply 208 which feeds PA 204. In some cases, the offset voltage of PA VCC voltage 209 may also be adjusted.

Specifically, the actual forward power gain of PA 204 is measured using directional couplers 207 (at the output) and 203 (at the input), log detectors 340 and 341, and difference amplifier 344. Directional couplers 207, 203 may be surface mounted types with 20 dB coupling factor, and the log detectors 340, 341 may be diode-type detectors configured with circuitry to provide a log response. Forward power at the input and output of PA 204 is represented by signals 230 and 240, respectively. Detectors 341 and 340 derive the envelope power from these signals 230, 240 and the difference between the envelope power in these signals 230, 240 is determined with difference amplifier 344, filtered with low pass filter 343, and converted 342 to a digital gain signal 345. Thus, digital power gain signal 345 represents the actual, measured power gain of PA 204.

The nominal gain of PA 204 is presented by expected gain calculation block 349, which provides the nominal expected value of the gain of PA 204 as expected under the current operating conditions (e.g., ambient temperature and RF carrier frequency). Typically, expected gain calculation block 349 will include a LUT (not shown) with this information and will receive information on such operating conditions. The difference 347 between the expected gain signal 348 and the digital power gain signal 345 is then determined using digital subtractor 346. Such difference value 347 is input to LUT 350. LUT 350 maps the various differences (dGain) between the measured and estimated gain of the PA 204 to the changes (dVcc) in PA VCC required. Typically, if the actual gain of PA 204 is greater or lesser than the expected gain of PA 204, PA VCC voltage 209 should be increased to account for a higher degree of mismatch seen by the output 210 of PA 204. The values contained in LUT 350 may be empirically derived by measuring the values of dGain (i.e., the difference between the actual and expected gains of the PA 204) and the corresponding adjustment (dVcc) from typical PA VCC voltage 209 required by PA 204 to maintain linearity performance, under various mismatch conditions. The output (reference) 351 of LUT 350 is input to VCC control block 311. Otherwise, the RF PA system 300C, including the operation of LUT 314, is substantially similar to the RF PA system 300A of FIG. 3A.

Figure 3D:
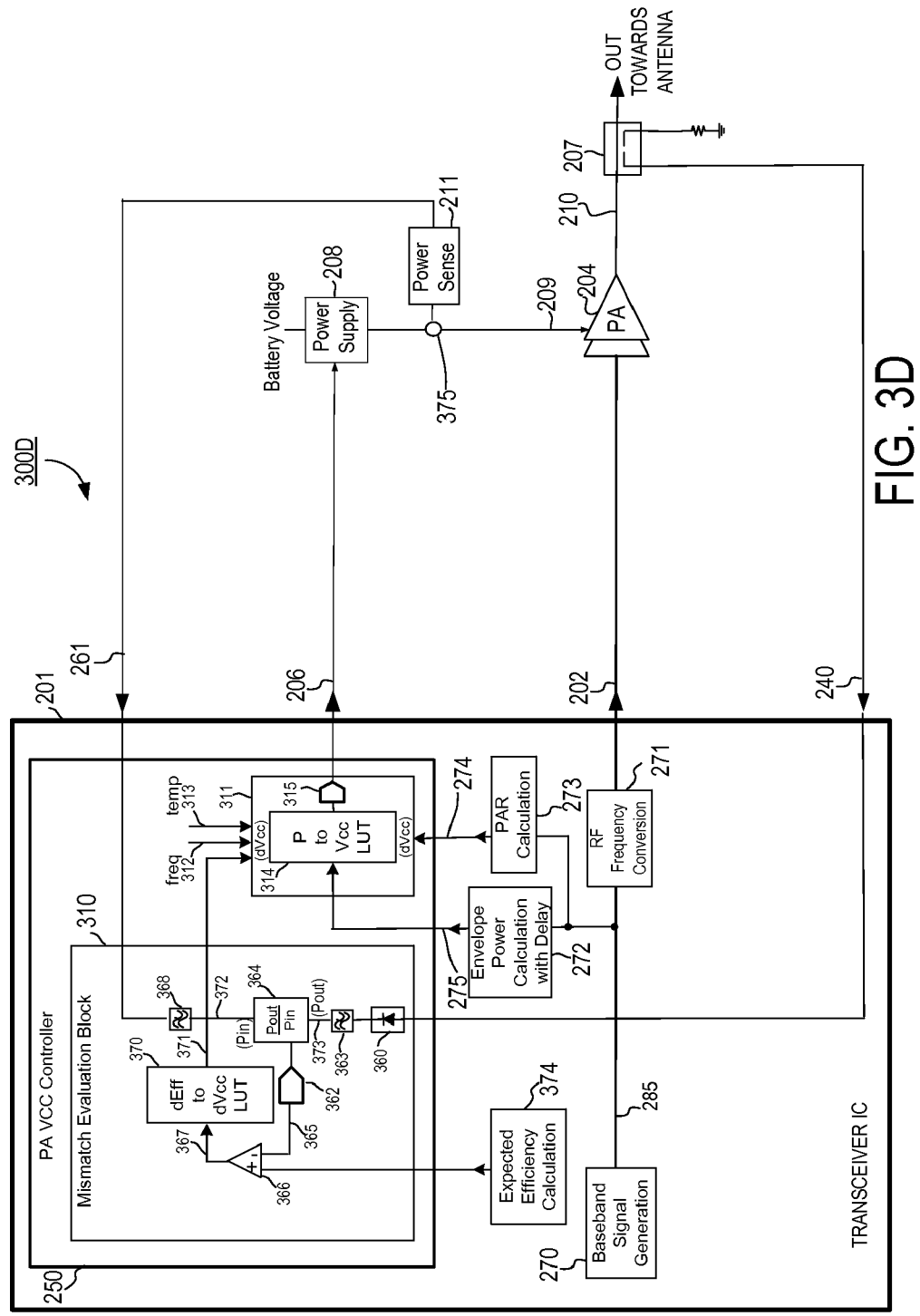
FIG. 3D illustrates an RF PA system that includes the details of the PA VCC controller according to a fourth embodiment of the present invention.

FIG. 3D illustrates an RF PA system that includes the details of the PA VCC controller according to a fourth embodiment of the present invention. The RF PA system 300D of FIG. 3D is also a variation of the RF PA system 300A of FIG. 3A. In this embodiment, mismatch evaluation block 310 evaluates the degree of impedance mismatch as seen at the output 210 of PA 204 by calculating the difference or ratio between the nominal efficiency of PA 204—as expected with PA 204 driving nominal impedance at its output 210 with no mismatch—and the actual measured efficiency of PA 204, and generates mismatch indicator signal 331 to indicate whether PA VCC voltage 209 should be increased or decreased due to this impedance mismatch. Mismatch indicator signal 371 is then input to VCC control block 311, influencing PA VCC controller 250 for generating a VCC control signal 206, which in turn controls the output voltage 209 from power supply 208 which feeds PA 204. In some cases, the offset voltage of PA VCC voltage 209 may also be adjusted.

Specifically, the actual efficiency of PA 204 is measured using power sense block 211, directional coupler 207 (at the output), power envelope detector 360, low pass filters 363 and 368, and divider 364. Power sense block 211 measures the supply (input) power 261 fed to PA 204 through the output 209 of power supply 208 by multiplying measured current at node 375 (assessed by measuring voltage across a series current sense resistor, not shown) by voltage (a simple measurement of the PA VCC voltage 209) at node 375. When the input power signal 261 is passed through low pass filter 368, the resulting signal 372 is representative of average input power to the PA 204. Power envelope detector 360 may be a diode-type detector. The RF output signal 210 of PA 204 is passed through power envelope detector 360 to detect the envelope power of the RF output signal 210, and the output of envelope power detector 360 is passed through low pass filter 363 to generate a signal 373 representative of average output envelope power. Efficiency of the PA 204 may be defined as output power of the PA 204 divided by the input power of the PA 204. Thus, divider 364, which may be a pair of log amplifiers followed by a subtractor, effectively divides signal 373 representative of the average output envelope power of PA 204 by signal 372 representative of the average input power of the PA 204. When the output of divider 364 is digitized by ADC 362, the resulting measured efficiency signal 365 indicates the measured efficiency of PA 204.

The nominal efficiency of PA 204 is presented by expected efficiency calculation block 374, which provides the nominal expected value of the efficiency of PA 204 as expected under the current operating conditions (e.g., output power of PA 204, ambient temperature, and the carrier frequency). Typically, expected efficiency calculation block 374 will include a LUT (not shown) with this information, and receive such operating conditions as inputs to determine the expected efficiency of the PA. The difference 367 between the digital measured efficiency signal 365 and the expected efficiency signal 366 is then determined using digital subtractor 366, and the difference 367 is input to reference a LUT 370. LUT 370 maps various values of the differences (dEff) in efficiencies of the PA 204 to the changes (dVcc) in PA VCC required. Typically, when the measured efficiency of PA 204 is greater than the expected efficiency of PA 204, PA VCC voltage 209 should be increased to account for a higher drive point impedance reflected to the final stage transistor in PA 204, while a measured efficiency less than the expected efficiency of PA 204 indicates that PA VCC voltage 209 should be decreased to account for a lower drive point impedance. The output (reference) 371 of LUT 370 is input to VCC control block 311. Otherwise, the RF PA system 300D, including the operation of LUT 314, is substantially similar to the RF PA system 300A of FIG. 3A.

Figure 3E:
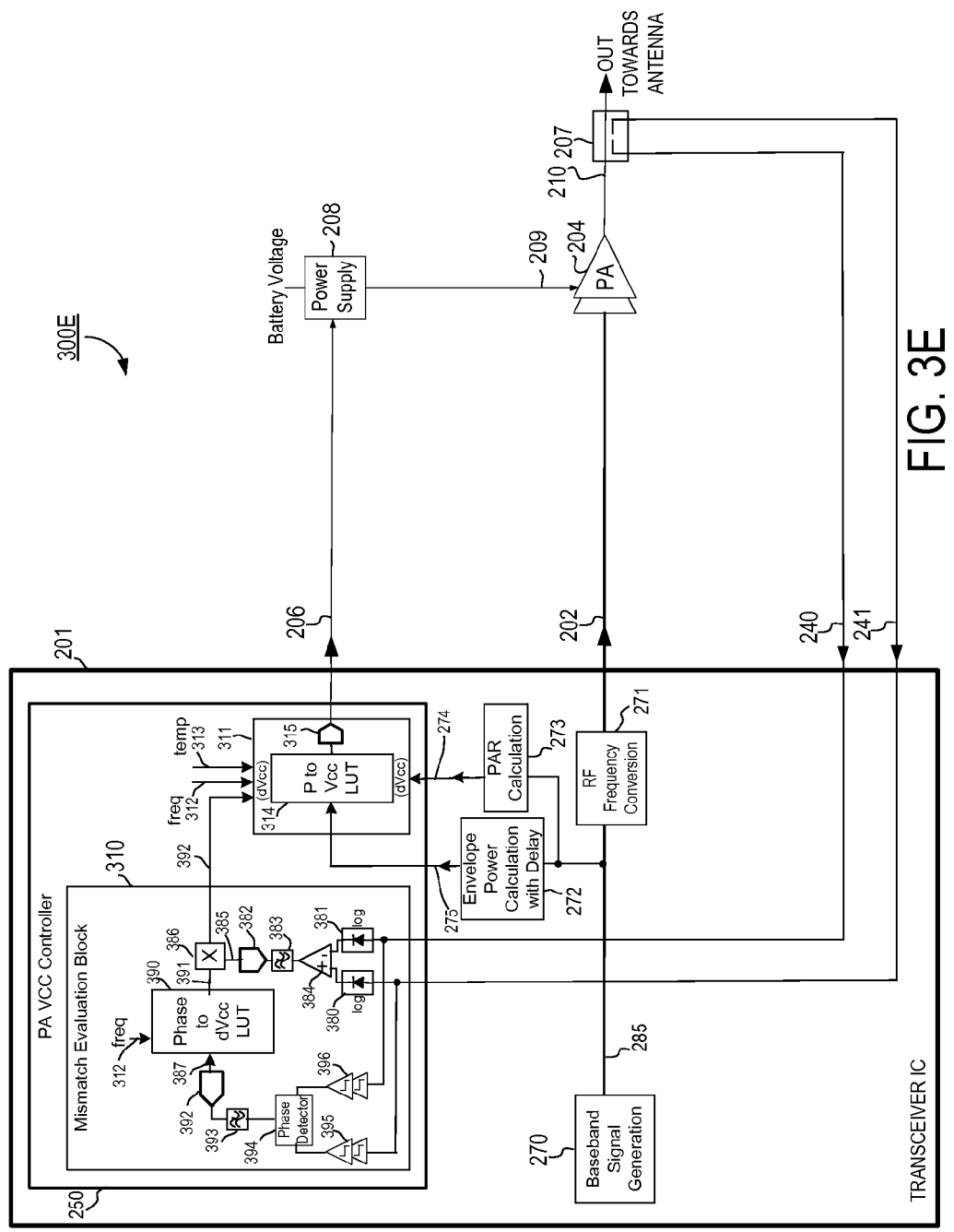
FIG. 3E illustrates an RF PA system that includes the details of the PA VCC controller according to a fifth embodiment of the present invention.

FIG. 3E illustrates an RF PA system that includes the details of the PA VCC controller according to a fifth embodiment of the present invention. The RF PA system 300E of FIG. 3E is also a variation of the RF PA system 300A of FIG.

3A. In the RF PA system 300E of FIG. 3E, mismatch evaluation block 310 evaluates the degree of impedance mismatch as seen at the output 210 of PA 204 by determining the angle and magnitude of the reflected power at the output 210 of the PA 204 using a directional coupler 207. As before, the mismatch evaluation block 310 generates mismatch indicator signal 392 to indicate whether PA VCC voltage 209 should be increased or decreased due to this impedance mismatch. Mismatch indicator signal 392 is then input to VCC control block 311, influencing PA VCC controller 250 for generating a VCC control signal 206, which in turn controls the output voltage 209 from power supply 208 which feeds PA 204. In some cases, the offset voltage of PA VCC voltage 209 may also be adjusted.

Specifically, the angle and magnitude of the reflected power at the output of the PA 204 is determined by comparing both the phase difference and amplitude ratio of the forward and reflected power of the PA 204, with samples of the forward and reflected power of the PA 204 provided by directional coupler 207 signals 240 and 241, respectively. For mismatch magnitude assessment, forward coupled power signal 240 and reverse coupled signal 241 are fed to log detectors 381 and 380, respectively, producing power envelope signals which are subtracted by difference amplifier 384. This output difference signal is then filtered by low pass filter 383 and converted to digital domain by ADC 382, yielding reflected amplitude ratio signal 385. This signal represents the ratio of reflected power to forward power at the output 210 of PA 204, and is thus a quantitative indication of the mismatch gamma value. For mismatch angle assessment, the phase difference between forward coupled power signal 240 and reverse coupled signal 241 is output by phase detector 394, after signals 240 and 241 pass through limiter amplifiers 396 and 395, respectively, to remove any amplitude information. Phase detector 394 outputs the phase difference to low pass filter 393 to average the result and remove any artifacts from phase detector 394, and the output of low pass filter 393 is then digitized by ADC 392 to produce reflected phase angle signal 387.

Reflected phase angle signal 387 references a value in LUT 390. LUT 390 maps various values of the reflected phase angle signal 387 to the changes in PA VCC required for the various values of the reflected phase angle 387. Frequency input 312 may adjust the values in the LUT to account for delays through the PA matching network which may cause a varying reflected phase angle at the PA output transistor drive point, depending on frequency. The output (reference) 391 of LUT 390 is further multiplied by reflected amplitude ratio signal 385 using multiplier 386. Thus, the change in PA VCC is weighed by the magnitude of the mismatch. Multiplier 386 may be substituted by a combination of a LUT and multiplier, which may provides a more customized function than a simple multiplication provided by multiplier 386. Mismatch indicator signal 392 is input to VCC control block 311. Otherwise, the RF PA system 300E, including the operation of LUT 314, is substantially similar to the RF PA system 300A of FIG. 3A.

Figure 3F:
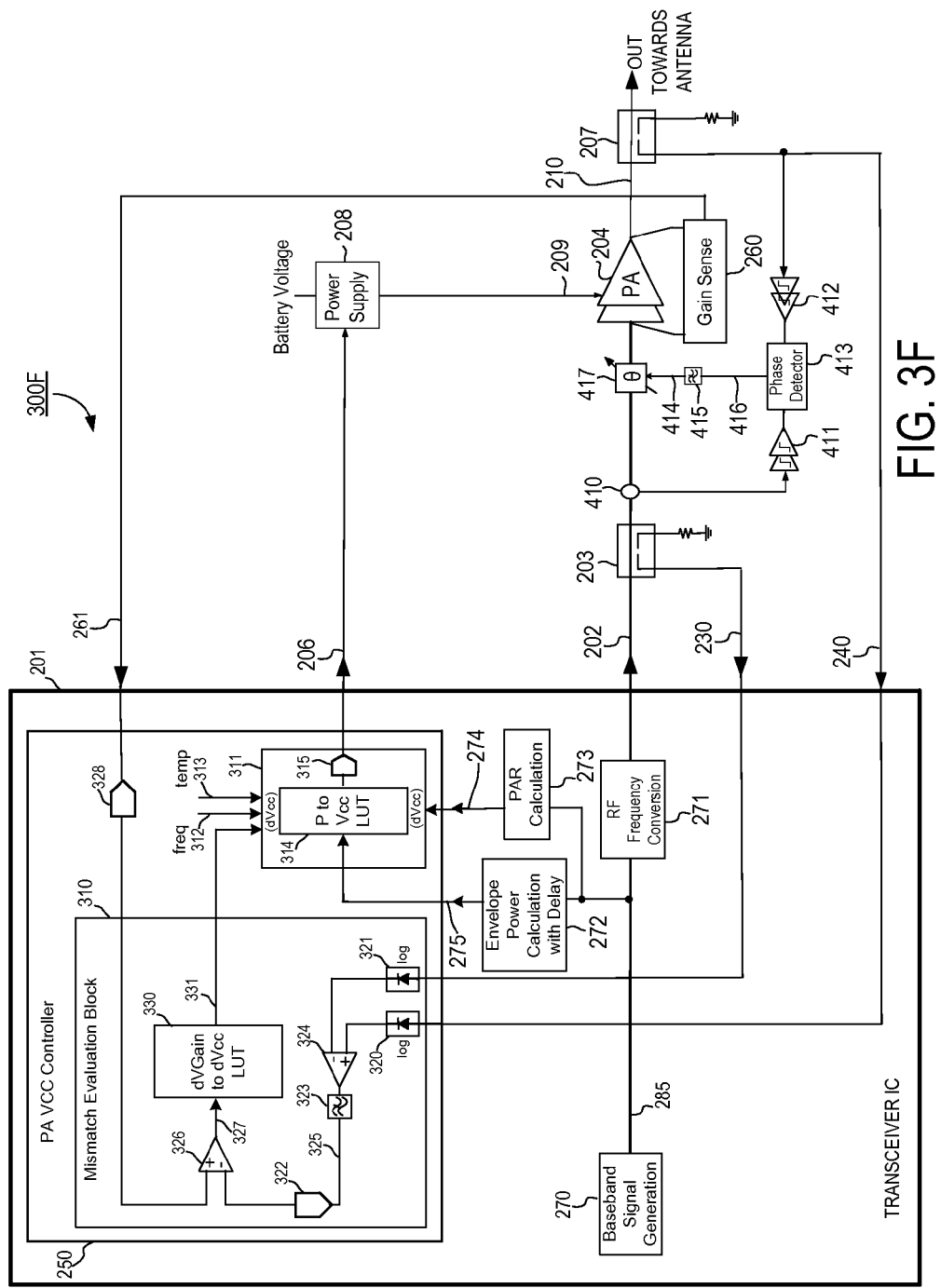
FIG. 3F illustrates an RF PA system that includes the details of the PA VCC controller according to a sixth embodiment of the present invention.

FIG. 3F illustrates an RF PA system that includes the details of the PA VCC controller according to a sixth embodiment of the present invention. The RF PA system 300F of FIG. 3F is also a variation of the RF PA system 300A of FIG. 3A, and adds phase correction circuitry to decrease phase distortion from PA 204 due to adjustments to PA VCC voltage 209 by PA VCC controller 250. Specifically, input signal 202 of the PA 204 is sensed using sensor 410 (sensor 410 may be a capacitive coupler) and fed to limiting amplifier 411 to remove any amplitude information from the signal. The output signal 210 of the PA 204 is sensed by directional coupler and fed to limiting amplifier 412 to remove any amplitude information from the signal. Phase detector 413 then effectively compares the phase of PA input signal 202 to the phase of PA output signal 210 to generate phase error signal 416, which is filtered by low pass filter 415 and input to phase shifter 417 that adjusts the phase of the input signal 202 based on the filtered phase error signal to correct any changes in the phase of the RF input signal 202.

While FIG. 3F shows the addition of phase correction circuitry to the system shown in FIG. 3A, it should be noted that the same phase correction circuitry may be added to any of the systems shown in FIGS. 3B, 3C, 3D, and 3E.

Figure 4:
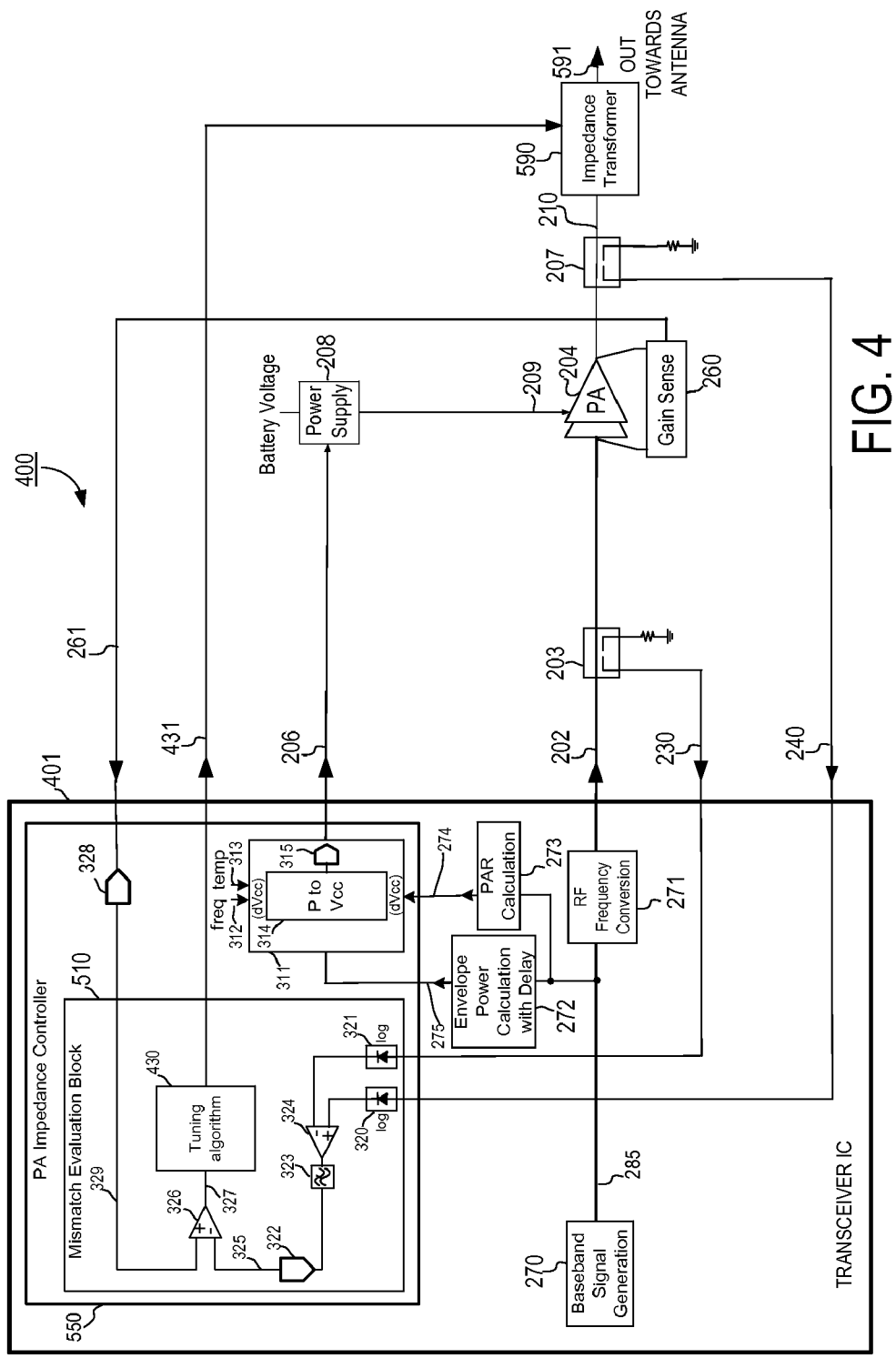
FIG. 4 illustrates an RF PA system that includes the details of the PA impedance controller according to another embodiment of the present invention.

FIG. 4 illustrates an RF PA system that includes the details of the PA impedance controller according to another embodiment of the present invention. The RF PA system 400 is substantially similar to the RF PA system 300A shown in FIG. 3A, but PA VCC controller 250 is replaced with PA impedance controller 550, which now contains a modified mismatch evaluation block 510, and an impedance transformer 590 is added at the output 210 of PA 204. As described previously, the difference between digital voltage gain signal 329 and digital power gain signal 325 is determined using digital subtractor 326, but in this case the difference 327 is input to tuning algorithm block 430. Tuning algorithm block 430 outputs tuning adjustment control signal 431 to tune impedance transformer 590 such that the difference signal 327 is reduced to zero. In other words, tuning algorithm block 430 may be part of a servo loop which attempts to force the difference 327 between the voltage gain and the power gain of the PA 204 to zero. Alternatively, tuning algorithm block 430 may cause tuning adjustment control signal 431 to cycle through various discrete steps until the difference 327 between the voltage gain and the power gain of the PA 204 is minimized. Impedance transformer 590 may contain at least one tunable reactive component which variably transforms impedance between the PA 204 output 210 and the output 591 of impedance transformer 590, and tuning algorithm block 430 may contain at least one variable voltage output used to adjust impedance transformer 590 through tuning adjustment control signal 431.

FIG. 4 shows impedance transformer near the output 201 of PA 204. However, impedance transformer 590 may instead be located nearer the antenna in some implementations.

While FIG. 4 shows an embodiment similar to the system shown in FIG. 3A, it should be noted that the changes made by replacing PA VCC controller with PA impedance controller 550 and adding impedance transformer 590 may be made to any of the systems shown in FIG. 3A, 3B, 3C, 3D, 3E, or 3F.

While FIGS. 2A, 2B, 3A, 3B, 3C, 3D, 3E, and 3F show PA VCC controller 250 contained within transceiver IC 201, other functional partitioning is possible. For example, PA VCC controller 250 may instead be partitioned away from transceiver IC 201, and instead may reside in a module which also contains PA 204. In this way, a sensing of various mismatch parameters may be more easily accomplished due to the proximity of PA VCC controller 250 to PA 204. Similarly, while FIG. 4 shows PA impedance controller 550 contained within transceiver IC 401. However, PA impedance controller 550 may instead be partitioned to reside in a module which also contains PA 204, to more easily accomplish the sensing of various mismatch parameters due to the proximity of PA impedance controller 550 to PA 204.

Figure 5:
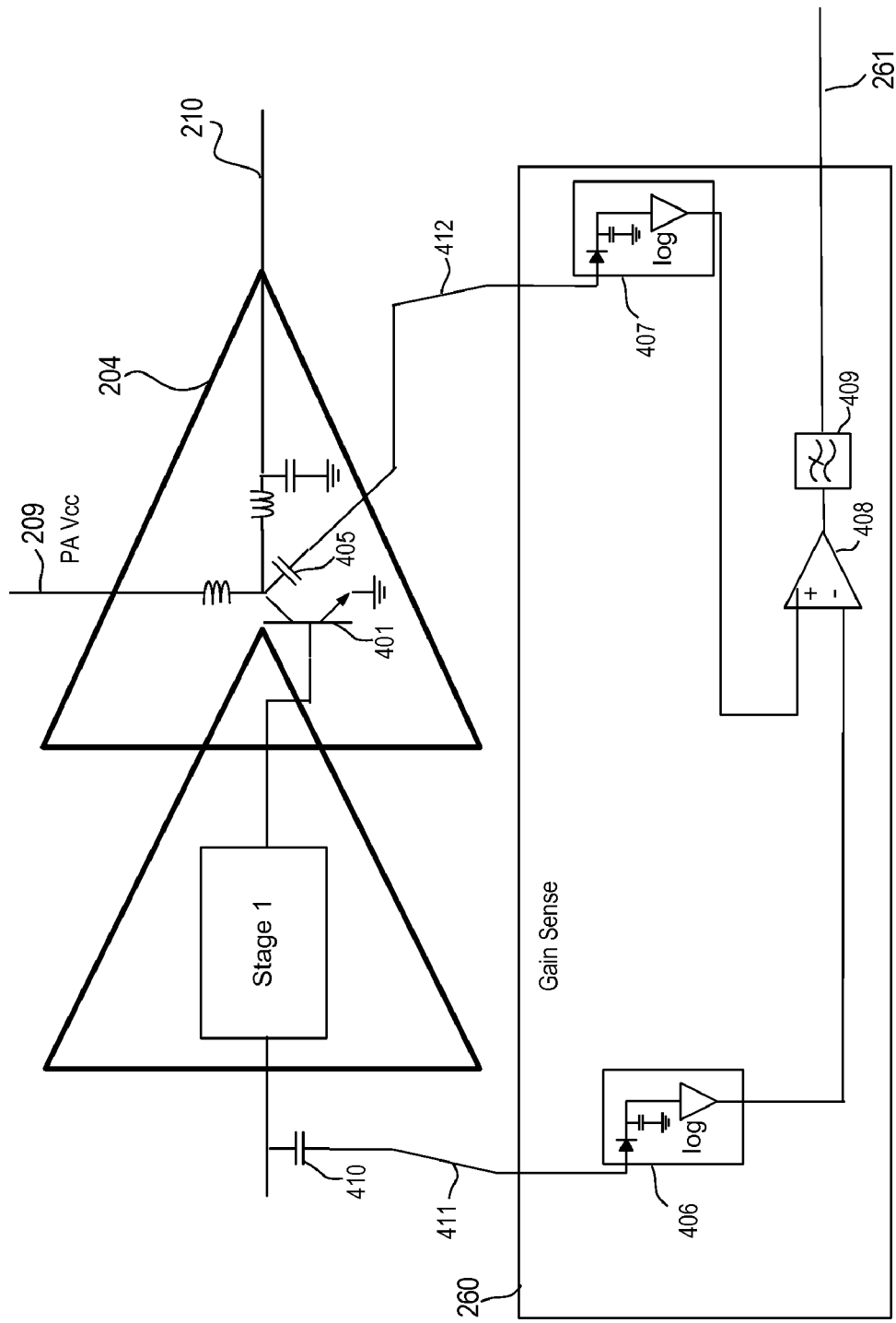
FIG. 5 illustrates the details of the gain sense block according to one embodiment of the present invention.

FIG. 5 illustrates the details of the gain sense block 260 used in FIGS. 2B, 3A, 3B, 3F, and 4, according to one embodiment of the present invention. Voltage peak detector/log amplifiers 406 and 407 are each comprised of a diode and capacitor in a peak detector configuration, followed by a logarithm amplifier which converts the voltages from the peak detectors into logarithms of the voltages. The input of PA 204 is sampled with capacitive tap 410 and fed to voltage peak detector/log amplifier 406, while the output of PA 204 is sampled with capacitive tap 405 directly at the collector drive point of the output transistor 401 in the final stage of PA 204 and fed to voltage peak detector/log amplifier 407. Thus, an accurate voltage gain of the PA 204 may be measured which is related to the voltage swing experienced by the collector of the transistor 401 comprising the last stage of PA 204. The difference between the outputs of voltage peak detector/log amplifiers 406 and 407 is determined using difference amplifier 408 and filtered using low pass filter 409. The output 261 of gain sense block 260 is therefore a true indication of the voltage gain of PA 204.

FIG. 5 also illustrates the details of PA 204. In one embodiment, PA VCC 209 ("VCC") is shown as delivering power exclusively to the collector of output transistor 401 in the final stage of PA 204. Thus, VCC 209 is distinct from ordinary bias or power supply connections feeding PA 204. In another embodiment, greater than 50% of the power consumed by PA 204 is delivered by VCC 209. Since output transistor 401 comprises the final stage of PA 204, this transistor 401 generates the greatest output power of all amplification stages within PA 204.

Upon reading this disclosure, those of skill in the art will appreciate still additional alternative structural and functional designs for the RF power amplifier VCC controller through the disclosed principles of the present invention. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention.

What is claimed is:

1. A radio frequency (RF) power amplifier system comprising:
   a power amplifier configured to receive and amplify an RF input signal to generate an RF output signal;
   a power calculation block configured to generate an envelope power signal indicative of an estimated instantaneous envelope power of the RF output signal based on a function of digital modulation components of the RF input signal and an estimation of a gain of the power amplifier, the power calculation block also including a time delay in generating the envelope power signal; and
   a power amplifier VCC controller coupled to the power amplifier and configured to generate a supply voltage control signal for controlling a supply voltage to the power amplifier at an amplitude modulation rate of the RF input signal by referencing the envelope power signal to a look-up-table, the look-up-table including values for the supply voltage control signal that correspond to the envelope power signal, the power amplifier VCC controller also adjusting the supply voltage control signal responsive to a parameter indicative of impedance mismatch at an output of the power amplifier.

2. The RF power amplifier system of claim 1, wherein the supply voltage delivers power exclusively to an output transistor in a final stage of the power amplifier.

3. The RF power amplifier system of claim 1, wherein greater than 50% of power consumed by the power amplifier is delivered to the power amplifier by the supply voltage.

4. The RF power amplifier system of claim 1, wherein the parameter indicative of impedance mismatch is determined as a difference or a ratio between a voltage gain and a forward power gain of the power amplifier.

5. The RF power amplifier system of claim 1, wherein the parameter indicative of impedance mismatch is determined as a difference or a ratio between a measured power gain and an expected power gain of the power amplifier.

6. The RF power amplifier system of claim 1, wherein the parameter indicative of impedance mismatch is determined as a difference or a ratio between a measured power efficiency and an expected power efficiency of the power amplifier.

7. The RF power amplifier system of claim 1, wherein the parameter indicative of impedance mismatch is determined as a phase difference between a forward power and a reflected power of the power amplifier.

8. The RF power amplifier system of claim 7, wherein the parameter indicative of impedance mismatch is further adjusted according to a magnitude difference between the forward power and the reflected power of the power amplifier.

9. The RF power amplifier system of claim 1, further comprising a phase control loop determining a phase error signal indicative of a phase difference between phases of the RF input signal and the RF output signal and adjusting the phase of the RF input signal based upon the phase error signal to reduce phase distortion generated by the power amplifier.

10. The RF power amplifier system of claim 1, wherein the power amplifier VCC controller further adjusts the supply voltage control signal based on a carrier frequency of the RF input signal.

11. The RF power amplifier system of claim 1, wherein the power amplifier VCC controller further adjusts the supply voltage control signal based on an ambient temperature.

12. The RF power amplifier system of claim 1, wherein the digital modulation components of the RF input signal are inphase (I) and quadrature (Q) components of the RF input signal.

13. A radio frequency (RF) power amplifier system comprising:
   a power amplifier coupled to receive and amplify an RF input signal to generate an RF output signal;
   an impedance transformer coupled to an output of the power amplifier;
   a power calculation block configured to generate an envelope power signal indicative of an estimated instantaneous envelope power of the RF output signal based on a function of digital modulation components of the RF input signal and an estimation of a gain of the power amplifier, the power calculation block also including a time delay in generating the envelope power signal; and
   a power amplifier controller coupled to the power amplifier and configured to generate a supply voltage control signal for controlling a supply voltage to the power amplifier at an amplitude modulation rate of the RF input signal by referencing the envelope power signal to a look-up-table, the look-up-table including values for the supply voltage control signal that correspond to the envelope power signal, and further configured to generate a tuning adjustment control signal for controlling an impedance of the impedance transformer responsive to a parameter indicative of impedance mismatch at the output of the power amplifier.

14. A radio frequency (RF) power amplifier system comprising:

a power amplifier configured to receive and amplify an RF input signal to generate an RF output signal;

a power calculation block to generate an envelope power signal indicative of an estimated instantaneous envelope power of the RF output signal based on input power to the power amplifier; and a power amplifier VCC controller coupled to the power amplifier and configured to generate a supply voltage control signal for controlling a supply voltage to the power amplifier at an amplitude modulation rate of the RF input signal responsive to the envelope power signal indicative of the estimated instantaneous envelope power of the RF output signal and a parameter indicative of impedance mismatch at an output of the power amplifier.

15. The RF power amplifier system of claim 14, wherein the supply voltage delivers power exclusively to an output transistor in a final stage of the power amplifier.

16. The RF power amplifier system of claim 14, wherein greater than 50% of power consumed by the power amplifier is delivered to the power amplifier by the supply voltage.

17. The RF power amplifier system of claim 14, wherein the parameter indicative of impedance mismatch is determined as a difference or a ratio between a voltage gain and a forward power gain of the power amplifier.

18. The RF power amplifier system of claim 14, wherein the parameter indicative of impedance mismatch is determined as a difference or a ratio between a measured power gain and an expected power gain of the power amplifier.

19. The RF power amplifier system of claim 14, wherein the parameter indicative of impedance mismatch is determined as a difference or a ratio between a measured power efficiency and an expected power efficiency of the power amplifier.

20. The RF power amplifier system of claim 14, wherein the parameter indicative of impedance mismatch is determined as a phase difference between a forward power and a reflected power of the power amplifier.

21. The RF power amplifier system of claim 20, wherein the parameter indicative of impedance mismatch is further adjusted according to a magnitude difference between the forward power and the reflected power of the power amplifier.

22. The RF power amplifier system of claim 14, further comprising a phase control loop determining a phase error signal indicative of a phase difference between phases of the RF input signal and the RF output signal and adjusting the phase of the RF input signal based upon the phase error signal to reduce phase distortion generated by the power amplifier.

23. The RF power amplifier system of claim 14, wherein the power amplifier VCC controller further adjusts the supply voltage control signal based on a carrier frequency of the RF input signal.

24. The RF power amplifier system of claim 14, wherein the power amplifier VCC controller further adjusts the supply voltage control signal based on an ambient temperature.

25. The RF power amplifier system of claim 14, wherein the power calculation block determines input power to the power amplifier as a function of digital modulation components of the RF input signal.

26. The RF power amplifier system of claim 25, wherein the digital modulation components of the RF input signal are inphase (I) and quadrature (Q) components of the RF input signal.

27. The RF power amplifier system of claim 14, wherein the power calculation block also includes a time delay in generating the envelope power signal.

28. The RF power amplifier system of claim 14, wherein the power amplifier VCC controller generates the supply control signal by referencing the envelope power signal to a look-up-table, the look-up-table including values for the supply voltage control signal that correspond to the envelope power signal, the power amplifier VCC controller further adjusting the supply voltage control signal responsive to the parameter indicative of impedance mismatch at the output of the power amplifier.

29. A radio frequency (RF) power amplifier system comprising:

a power amplifier coupled to receive and amplify an RF input signal to generate an RF output signal;

an impedance transformer coupled to an output of the power amplifier;

a power calculation block configured to generate an envelope power signal indicative of an estimated instantaneous envelope power of the RF output signal based on input power to the power amplifier; and an impedance controller coupled to the power amplifier and configured to generate a supply voltage control signal for controlling a supply voltage to the power amplifier at an amplitude modulation rate of the RF input signal responsive to the envelope power signal indicative of the estimated instantaneous envelope power of the RF output signal and further configured to generate a tuning adjustment control signal for controlling an impedance of the impedance transformer responsive to a parameter indicative of impedance mismatch at the output of the power amplifier.

30. The RF power amplifier system of claim 14, wherein the power calculation block generates the envelope power signal indicative of the estimated instantaneous envelope power of the RF output signal based on an estimation of a gain of the power amplifier.

* * * * *